(12) United States Patent
Liu et al.

(10) Patent No.: US 7,474,049 B2
(45) Date of Patent: Jan. 6, 2009

(54) ORGANIC ELECTROLUMINESCENT DEVICE

(75) Inventors: Tswen-Hsin Liu, Jhudong Township, Hsinchu County (TW); Tze-Chien Tsai, Sijhih (TW)

(73) Assignee: AU Optronics Corp., Hsin-chu (TW)

( * ) Notice: Subject to any disclaimer, the term of this patent is extended or adjusted under 35 U.S.C. 154(b) by 466 days.

(21) Appl. No.: 11/260,275

(22) Filed: Oct. 28, 2005

(65) Prior Publication Data

US 2007/0241669 A1  Oct. 18, 2007

(30) Foreign Application Priority Data

Mar. 23, 2005  (TW) ............... 94109031 A

(51) Int. Cl.
  *H01J 1/62* (2006.01)
  *H01J 63/04* (2006.01)
  *H05B 33/00* (2006.01)

(52) U.S. Cl. .................. 313/504; 313/506; 428/917

(58) Field of Classification Search ................ 313/504, 313/506; 428/917
  See application file for complete search history.

(56) References Cited

U.S. PATENT DOCUMENTS

| 6,627,333 | B2 | 9/2003 | Hatwar |
| 6,696,177 | B1 | 2/2004 | Hatwar |
| 6,700,322 | B1 | 3/2004 | Duggal et al. |
| 6,720,092 | B2 | 4/2004 | Hatwar |
| 6,933,522 | B2 * | 8/2005 | Lin et al. ................ 257/40 |
| 2002/0125818 | A1 | 9/2002 | Sato et al. |
| 2005/0006625 | A1 * | 1/2005 | Seo et al. ............ 252/301.16 |
| 2005/0099116 | A1 * | 5/2005 | Koide .................. 313/504 |
| 2006/0008673 | A1 * | 1/2006 | Kwong et al. ............ 428/690 |

FOREIGN PATENT DOCUMENTS

| CN | 1402885 | 3/2003 |
| CN | 1438829 | 8/2003 |
| CN | 1665359 A | 9/2005 |
| JP | 2004-31211 | 1/2004 |
| TW | 556446 | 10/2003 |

* cited by examiner

*Primary Examiner*—Ashok Patel
(74) *Attorney, Agent, or Firm*—Rabin & Berdo, PC

(57) ABSTRACT

An organic electroluminescent device (OELD) is provided. The OELD includes a substrate, a first electrode, a second electrode, a hole transport layer, an electron transport layer and two emissive layers. The first electrode and the second electrode are disposed over the substrate. The hole transport layer is disposed between the first electrode and the second electrode. The electron transport layer is disposed between the second electrode and the hole transport layer. The emissive layers are disposed between the hole transport layer and the electron transport layer. One of the emissive layers is a fluorescent emissive layer and another one of the emissive layers is a phosphorescent emissive layer. The visible light of the fluorescent emissive layer and the phosphorescent emissive layer are not absorbed by each other and the visible light spectrums of the fluorescent emissive layer and the phosphorescent emissive layer are not affected by each other.

16 Claims, 3 Drawing Sheets

ORGANIC ELECTROLUMINESCENT DEVICE

This application claims the benefit of Taiwan application Serial No. 094109031, filed Mar. 23, 2005, the subject matter of which is incorporated herein by reference.

BACKGROUND OF THE INVENTION

1. Field of the Invention

The present invention relates in general to an organic electroluminescent device and, more particularly, to an organic electroluminescent device capable of emitting visible phosphorescence and emitting visible fluorescence at the same time.

2. Description of the Related Art

A conventional organic electroluminescent device (OELD) is a multi-layer structure including a substrate, an anode, a cathode, a hole injection layer, a hole transport layer, an electron transport layer, an electron injection layer and an emissive layer. The anode, the hole injection layer, the hole transport layer, the emissive layer, the electron transport layer, the electron injection layer and the cathode are disposed on the substrate orderly from bottom to top. The emissive layer includes a host-dopant system, in which a few dopants are doped in host material. How to define the host-dopant system to be a fluorescent host-dopant system or a phosphorescent host-dopant system is illustrated as follows.

When a voltage is applied to the cathode and the anode, electrons are injected into the emissive layer from the cathode through the electron injection layer and the electron transport layer. Holes are injected into the emissive layer from the anode through the hole injection layer and the hole transport layer. After the electrons and the holes combine in the emissive layer, the host material is excited from a ground state to an excited state. Because the host material in the excited state is unstable, the host material certainly returns to the ground state and transfer energy to the dopants.

When the dopants receiving the energy are excited from the ground state to the excited state, singlet excitons and triplet excitons are generated by the dopants. In both the fluorescent dopants and the phosphorescent dopants, due to the distribution ratio of the electron spin state, the probability of forming the triplet excitons and the singlet excitons is approximately 3:1.

Electroluminescence occurs in the organic electroluminescent device while the singlet excitons or the triplet excitons return to the ground state by releasing photons. In the fluorescent host-dopant system, only the singlet excitons emit visible fluorescence when returning to the ground state. In the phosphorescent host-dopant system, when returning to the ground state, the triplet excitons emit visible phosphorescence and the singlet excitons emit light which can be transferred to phosphorescence through internal system crossing (ISC).

In the fluorescent host-dopant system, the exciton lifetime of the singlet excitons when returning to the ground state from the excited state is approximately rated in nanoseconds (ns), and the visible fluorescence is emitted during the exciton lifetime.

In the phosphorescent host-dopant system, the exciton lifetime of the triplet excitons when returning to the ground state from the excited state is rated approximately in microseconds ($\mu$s), and the visible phosphorescence is emitted during the exciton lifetime. In the organic electroluminescence mechanism, the internal quantum efficiency of the phosphorescent dopants is approximately 4 times the internal quantum efficiency of the fluorescent dopants (the theoretical value can be 100%) due to the following two reason: (1) the distribution ratio of the electron spin state results in the probability of forming the triplet excitons and the singlet excitons to be 3:1; and (2) the phosphorescent dopants can transfer the energy from the singlet excitons of the host material to the triplet excitons of the dopants. In other words, 25% of light emitted from the organic electroluminescent device is fluorescence in the singlet state, and 75% of the light emitted from the organic electroluminescent device is phosphorescence in the triplet state. In the phosphorescent dopants, the singlet excitons are transferred to the triplet excitons to enable the internal quantum efficiency to be 100%. Therefore, the luminance efficiency of the organic electroluminescent device having the phosphorescent host-dopant system (such as a phosphorescent device) is better than the luminance efficiency of the organic, electroluminescent device having the fluorescent host-dopant system (such as a fluorescent device).

However, the long exciton lifetime is a disadvantage of the phosphorescent host-dopant system. The exciton lifetime of the triplet excitons is rated in microseconds ($\mu$s); that is, the time when the triplet excitons stay in the emissive layer is approximately 1000 times the time of the singlet excitons. Therefore, the long staying time of the triplet excitons in the emissive layer results in triplet-triplet annihilation. In other words, one triplet exciton in the excited state tends to collide with another triplet in the excited state, resulting in the energy of the two triplet excitons lost in the form of heat or vibration instead of releasing photons. Therefore, the luminance efficiency of the organic electroluminescent device having the phosphorescent host-dopant system (such as phosphorescent device) declines rapidly as the electric current increases.

SUMMARY OF THE INVENTION

It is therefore an object of the present invention to provide an organic electroluminescent device (OELD) capable of emitting visible phosphorescence and visible fluorescence at the same time. Because the luminance efficiency of the phosphorescent emissive layer is better than that of the fluorescent emissive layer, the luminance efficiency of the organic electroluminescent device of the present invention is better than that of the conventional organic electroluminescent device having only the fluorescent host-dopant system (such as a fluorescent device). Moreover, because the concentration of the phosphorescent excitons is diluted by the fluorescent excitons, the colliding probability of the triplet excitons is decreased effectively, avoiding the triplet-triplet annihilation. The declination of the luminance efficiency of the organic electroluminescent device of the present invention in high operating brightness is therefore restrained. As a result, the brightness and the luminance efficiency of the organic electroluminescent device of the present invention are much better than those of the conventional phosphorescent devices.

The present invention achieves the above-identified objects by providing an organic electroluminescent device including a substrate, a first electrode, a second electrode, a hole transport layer, an electron transport layer and at least two emissive layers. The first electrode and the second electrode opposite to the first electrode are disposed over the substrate. The hole transport layer is disposed between the first electrode and the second electrode. The electron transport layer is disposed between the second electrode and the hole transport layer. At least two emissive layers are disposed between the hole transport layer and the electron transport layer. One of the at least two emissive layers is a fluorescent emissive layer and another of the at least two emissive layer is a phosphorescent emissive layer. The visible light of the fluorescent emissive layer and the visible light of the phosphorescent emissive layer are not absorbed by each other and the visible light spectrums of the fluorescent emissive layer and the visible light spectrums of the phosphorescent emissive layer are not affected by each other.

The present invention achieves the above-identified objects by providing a flat panel display including the organic electroluminescent device described above.

The present invention achieves the above-identified objects by providing a portable display device having the organic electroluminescent device described above.

Other objects, features, and advantages of the present invention will become apparent from the following detailed description of the preferred but non-limiting embodiments. The following description is made with reference to the accompanying drawings.

DETAILED DESCRIPTION OF THE INVENTION

First Embodiment

Figures 1, 2A, 2B, 3A, 3B:
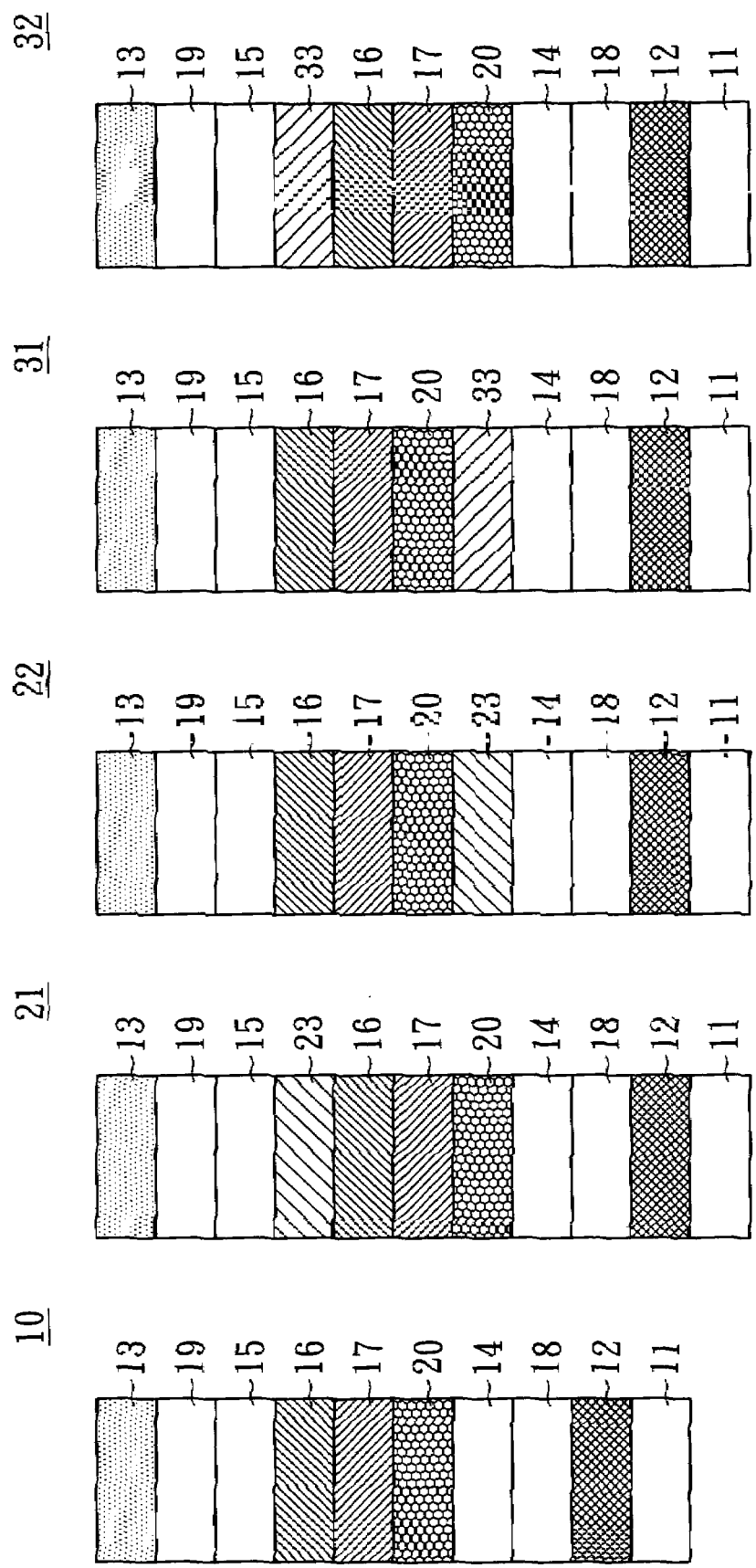
FIG. 1 is a sectional view of an organic electroluminescent device (OELD) according to the first embodiment of the present invention.
FIG. 2A is a cross-sectional view of an organic electroluminescent device according to the second embodiment of the present invention.
FIG. 2B is a cross-sectional view of another organic electroluminescent device according to the second embodiment of the present invention.
FIG. 3A is a cross-sectional view of an organic electroluminescent devices according to the third embodiment of the present invention.
FIG. 3B is a cross-sectional view of another organic electroluminescent devices according to the third embodiment of the present invention.

Referring to FIG. 1, a sectional view of an organic electroluminescent device (OELD) according to the first embodiment of the present invention is provided. The organic electroluminescent device includes an organic light emitting diode (OLED) and a polymer light emitting diode (PLED). The OLED is illustrated in the present embodiment of the invention. However, the skill revealed in the present embodiment of the invention can be applied to PLED as well.

In FIG. 1, the organic electroluminescent device 10 includes a substrate 11, a first electrode 12, a second electrode 13, a hole transport layer 14, an electron transport layer 15 and at least two emissive layers. The first electrode 12 (such as anode) and the second electrode 13 (such as cathode) opposite to the first electrode 12 are disposed over the substrate 11. The hole transport layer 14 is disposed between the first electrode 12 and the second electrode 13. The electron transport layer 15 is disposed between the second electrode 13 and the hole transport layer 14. At least two emissive layers are disposed between the hole transport layer 14 and the electron transport layer 15. One of the at least two emissive layers is the first fluorescent emissive layer 16, and another of the at least two emissive layer is the first phosphorescent emissive layer 17.

In the present embodiment of the invention, the at least two emissive layers can be host-dopant systems. For example, the first fluorescent emissive layer 16 includes fluorescent host material and fluorescent dopants, and the first phosphorescent emissive layer 17 includes phosphorescent host material and phosphorescent dopants. However, the at least two emissive layers are not limited to the design as mentioned above.

When the first electrode 12 and the second electrode 13 are applied to a voltage, electrons are injected into the two emissive layers from the second electrode 13 through the electron transport layer 15. Holes are injected into the two emissive layers from the first electrode 12 through the hole transport layer 14. When the electrons and the holes combine in the two emissive layers, the phosphorescent host material and the fluorescent host material are excited from a ground state to an excited state. When the phosphorescent host material and the fluorescent host material return to the ground state from the excited state, the phosphorescent host material and the fluorescent host material transfer energy to the phosphorescent dopants and the fluorescent dopants, respectively. Therefore, both the phosphorescent host material and the fluorescent host material generate singlet excitons and triplet excitons. When returning to the ground state, the singlet excitons of the fluorescent dopants emit fluorescence, and the triplet excitons of the phosphorescent dopants emit phosphorescence. Moreover, the singlet excitons of the phosphorescent dopants transform into the triplet excitons through an internal system crossing (ISC) of the phosphorescent dopants, and the visible phosphorescence is emitted consequently. Therefore, the visible phosphorescence and the visible fluorescence are emitted at the same time, and the visible light of the first fluorescent emissive layer and the first phosphorescent emissive layer are not absorbed by each other, and the visible light spectrums of the first fluorescent emissive layer and the first phosphorescent emissive layer are not affected by each other.

In the organic electroluminescent device 10 of the present embodiment of the invention, the first phosphorescent emissive layer 17 is disposed over the hole transport layer 14. The first fluorescent emissive layer 16 is disposed between the first phosphorescent emissive layer 17 and the electron transport layer 15.

Furthermore, the organic electroluminescent device 10 can further includes an electron injection layer 19 and a hole injection layer 18. The electron injection layer 19 is disposed between the second electrode 13 and the electron transport layer 15. The hole injection layer 18 is disposed between the first electrode 12 and the hole transport layer 14. The organic electroluminescent device 10 can further includes an exciton blocking layer 20. The exciton blocking layer 20 is adjacent to the first phosphorescent emissive layer 17. For example, the exciton blocking layer 20 is disposed between the hole transport layer 14 and the first phosphorescent emissive layer 17. Furthermore, the exciton blocking layer 20 can be disposed between the first phosphorescent emissive layer 17 and the first fluorescent emissive layer 16.

However, a person having ordinary skill in the art of the present invention can understand that the present invention is not limited thereto. For example, the color of the visible light emitted from the first fluorescent emissive layer 16 is substantially identical to or substantially different from the color of the visible light emitted from the first phosphorescent emissive layer 17. The color of the light emitted from the first fluorescent emissive layer 16 includes red (R), green (G), or blue (B). The wavelength of the light ranges from about 400 nanometers to about 700 nanometers (nm). The color of the light emitted from the first phosphorescent emissive layer 17 includes red (R), green (G), or blue (B). The wavelength thereof ranges from about 400 nanometers (nm) to about 700 nanometers (nm). The color of the light emitted from the organic electroluminescent device 10 can be adjusted by mixing the color of the light emitted from the first fluorescent emissive layer 16 and the color of the light emitted from the first phosphorescent emissive layer 17. For example, when the colors emitted from the first fluorescent emissive layer 16 and the first phosphorescent emissive layer 17 are cyan and yellow, the color of the visible light emitted from the organic electroluminescent device 10 is two-element white mixed by cyan and yellow.

As to the phosphorescent materials, the material of the blue phosphorescent dopants can be FIrpic, and the material of the red phosphorescent dopants can be $(CF_3ppy)_2Ir(pic)$. The material of the green phosphorescent dopants can be $Ir(ppy)_3$ and the material of the greenish-blue phosphorescent dopants can be $(btp)_2Ir(acac)$. Furthermore, the material of the host material matching the phosphorescent dopants described above can be $Alq_3$, CBP, CDBP, or TCTA. The formulas of the luminant materials described above are illustrated as follows:

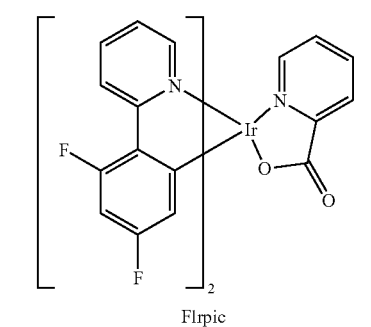

FIrpic

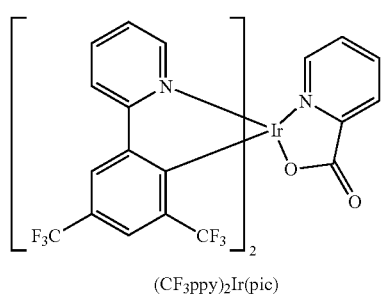

(CF₃ppy)₂Ir(pic)

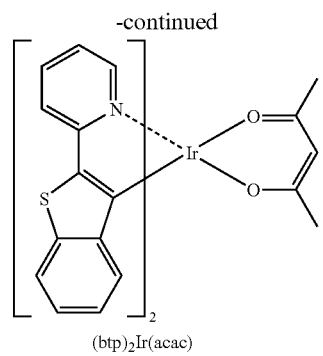

(btp)₂Ir(acac)

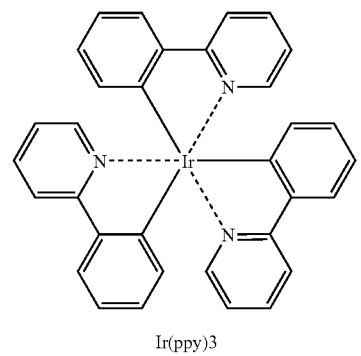

Ir(ppy)3

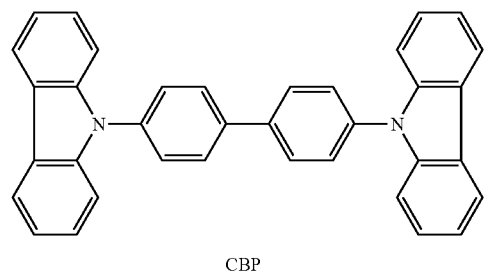

CBP

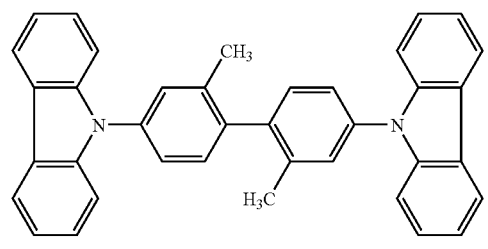

CDBP

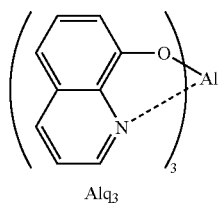

Alq₃

-continued

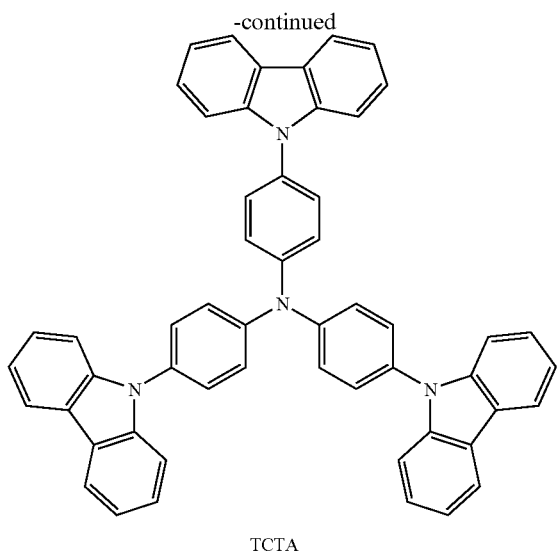

TCTA

As to the fluorescent luminant materials, the material of the red fluorescent dopants can be DCJTB (4-(dicyanomethylene)-2-t-butyl-6-(1,1,7,7-tetramethyl-julolidyl-9-enyl)-4H-pyran)). The material of the yellow fluorescent dopants can be rubrene(Rb) or TBRb. The material of the sky-blue fluorescent dopants can be DSA-Ph. The material of the host material matching the fluorescent dopants described above can be $Alq_3$, 1,1-bis[N-(1-naphthyl)-N'-phenylamino]biphenyl-4,4' diamine(NPB) or MADN. The formulas of Rb, DSA-Ph, TBRb, MADN, or DCJTB are illustrated as follows:

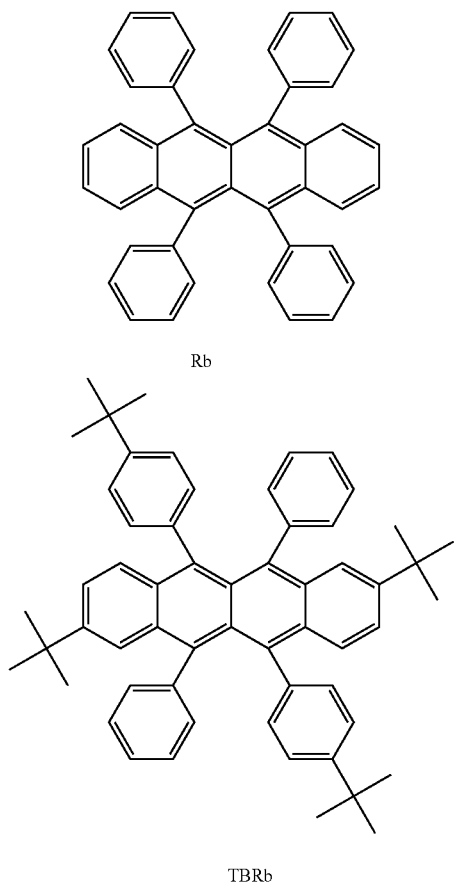

Rb

TBRb

-continued

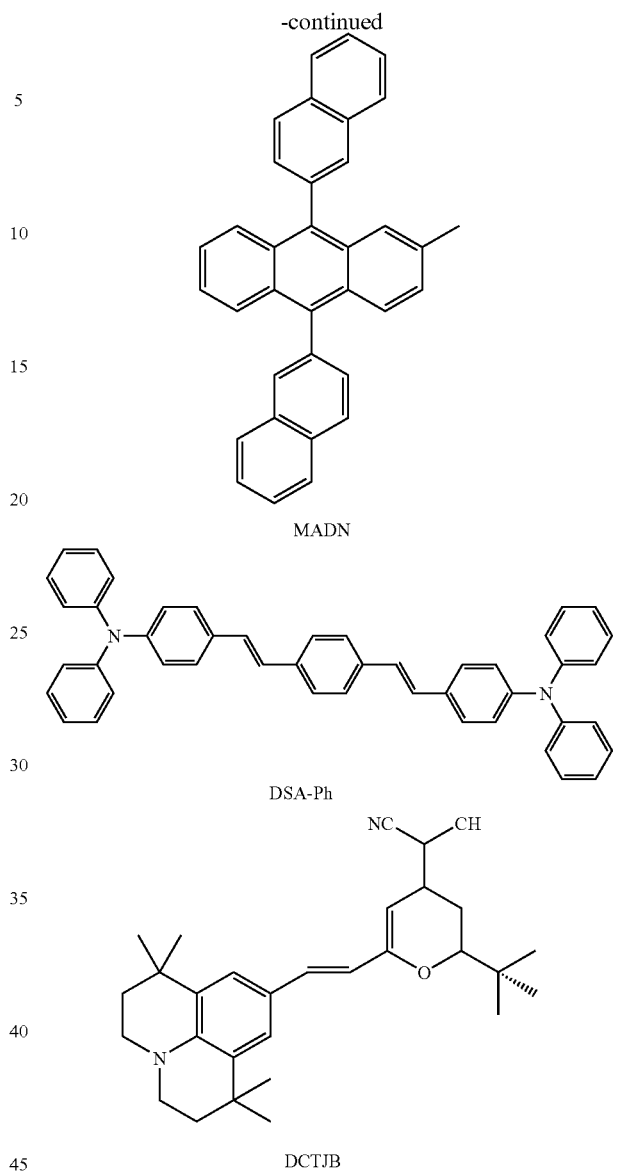

MADN

DSA-Ph

DCTJB

Moreover, the material of the first electrode 12 and the second electrode 13 can be metal, metal alloy, or transparent electrically conductive material. One of the first electrode 12 and the second electrode 13 is transparent or translucent electrode. The transparent electrically conductive materials described above include indium tin oxide (ITO), indium zinc oxide (IZO), cadmium tin oxide (CTO), stannum dioxide ($SnO_2$), zinc oxide (ZnO), or other transparent metal oxides. The metal and metal alloy described above includes aurum (Au), aluminum (Al), indium (In), magnesium (Mg), or calcium (Ca).

When only the first electrode 12 is transparent or translucent, the second electrode 13 can be a reflective metal. The organic electroluminescent device 10 is therefore a bottom emissive device, and the substrate 11 must be transparent or translucent substrate. When only the second electrode 13 is transparent or translucent, the first electrode 12 can be a reflective metal. The organic electroluminescent device 10 is therefore a top emissive device, and the substrate 11 can be transparent, translucent or non-transparent substrate. When both the first electrode 12 and the second electrode 13 are transparent or translucent, the organic electroluminescent device 10 is therefore a dual emissive device, and the substrate 11 must be transparent or translucent substrate.

The phosphorescent emissive layer and the fluorescent emissive layer are disposed in the organic electroluminescent device of the present embodiment of the invention. Because the luminance efficiency of the phosphorescent emissive layer is better than that of the fluorescent emissive layer, the luminance efficiency of the organic electroluminescent device of the present embodiment of the invention is better than that of the conventional organic electroluminescent device having only the fluorescent host-dopant system (such as a fluorescent device). Furthermore, when compared with the conventional organic electroluminescent device having only the phosphorescent host-dopant system (such as a phosphorescent device), the concentration of the triplet excitons is decreased in the organic electroluminescent device of the present embodiment of the invention including the phosphorescent emissive layer and the fluorescent emissive layer. As a result, the colliding probability of the triplet excitons is lowered and the triplet-triplet annihilation is therefore avoided. Accordingly, the luminance efficiency of the organic electroluminescent device of the present embodiment of the invention is not reduced due to an inner exhaustion of triplet-triplet annihilation in high operating brightness. The brightness and the luminance efficiency of the organic electroluminescent device of the present embodiment of the invention can be much better than those of the conventional phosphorescent device in high operating current density.

In the white light organic electroluminescent device revealed in the present embodiment of the invention, the white light spectrum is composed of two or more emissive spectrums with different wavelengths. At least one of the emissive spectrums corresponds to the electroluminescence which occurs while the triplet excitons return to the ground state by releasing photons. The exciton lifetime of the triplet exciton is rated in microseconds (μs). At least one of the emissive spectrums corresponds to the electroluminescence which occurs while the singlet excitons return to the ground state by releasing photons. The exciton lifetime of the singlet exciton is rated in nanoseconds (ns). Moreover, in the white light spectrums described above, the longer wavelength spectrum corresponds to the electroluminescence which occurs while the triplet excitons return to the ground state by releasing photons, and the shorter wavelength spectrum corresponds to the electroluminescence which occurs while the singlet excitons return to the ground state by releasing photons.

Second Embodiment

Referring to FIG. 2A-2B, cross-sectional views of organic electroluminescent devices according to the second embodiment of the present invention are illustrated. Compared with the organic electroluminescent device 10 of the first embodiment of the present invention, the organic electroluminescent devices 21 and 22 of the present embodiment of the invention further include the second fluorescent emissive layer 23. The same other elements using the same reference numbers are not illustrated redundantly.

In FIG. 2A, the second fluorescent emissive layer 23 is disposed between the first fluorescent emissive layer 16 and the electron transport layer 15.

In FIG. 2B, the second fluorescent emissive layer 23 is disposed between the first phosphorescent emissive layer 17 and the hole transport layer 14. In other words, the second fluorescent emissive layer 23 is disposed between the exciton blocking layer 20 and the hole transport layer 14.

However, a person having ordinary skill in the art of the present invention can understand that the present invention is not limited thereto. For example, the electron injection layer 19, the hole injection layer 18 and the exciton blocking layer 20 can be omitted in the organic electroluminescent devices 21 and 22. Moreover, the color of the visible light emitted from the second fluorescent emissive layer 23 is substantially identical to or substantially different from the color of the visible light emitted from the first fluorescent emissive layer 16. The color of the visible light emitted from the second fluorescent emissive layer 23 includes red (R), green (G), or blue (B). The wavelength thereof ranges from about 400 nanometers (nm) to about 700 nanometers (nm).

Because the phosphorescent guest emitter emitting blue phosphorescence is not developed successfully, it is difficult to manufacture a fully phosphorescent white light OLED. Therefore, the organic electroluminescent device of the present embodiment of the invention recovers the disadvantages by utilizing the blue fluorescent emissive layer. A highly efficient white light OLED having full wavelength is provided by combining the blue fluorescent emissive layer, the red phosphorescent emissive layer and the green phosphorescent emissive layer. For example, when the colors of the visible light emitted from the first fluorescent emissive layer 16 and the second fluorescent emissive layer 23 are blue (B), and green (G), and the color of the visible light emitted from the first phosphorescent emissive layer 17 are red (R), the light emitted from the organic electroluminescent devices 21 and 22 is three-element white mixed by red (R), green (G), and blue (B). Moreover, the colors of the light emitted from the organic electroluminescent devices 21 and 22 are not limited to the three-element white and can be adjusted by mixing the visible light emitted from the first fluorescent emissive layer 16, the first phosphorescent emissive layer 17 and the second fluorescent emissive layer 23.

Third Embodiment

Referring to FIG. 3A-3B, two cross-sectional views of organic electroluminescent devices according to the third embodiment of the present invention are illustrated. Compared with the organic electroluminescent device 10 of the first embodiment of the present invention, the organic electroluminescent devices 31 and 32 of the present embodiment of the invention further include the second phosphorescent emissive layer 33. The same other elements having the same reference numbers are not illustrated redundantly.

In FIG. 3A, the second phosphorescent emissive layer 33 is disposed between the first phosphorescent emissive layer 17 and the hole transport layer 14. In other words, the second phosphorescent emissive layer 33 is disposed between the exciton blocking layer 30 and the hole transport layer 14.

In FIG. 3B, the second phosphorescent emissive layer 33 is disposed between the first fluorescent emissive layer 16 and the electron transport layer 15. The organic electroluminescent devices 31 and 32 described above can further includes another exciton blocking layer adjacent to the second phosphorescent emissive layer 33.

However, a person having ordinary skill in the art of the present invention can understand that the present invention is not limited thereto. For example, the electron injection layer 19, the hole injection layer 18 and the exciton blocking layer 20 can be omitted in the organic electroluminescent devices 31 and 32. Moreover, the color of the light emitted from the second phosphorescent emissive layer 33 is substantially identical to or substantially different from the color of the visible light emitted from the first phosphorescent emissive layer 17. The color of the visible light emitted from the second phosphorescent emissive layer 33 includes red (R), green (G), and blue (B). The wavelength thereof ranges from about 400 nanometers (nm) to about 700 nanometers (nm).

Furthermore, the colors of the light emitted from the electroluminescent devices 31 and 32 can be adjusted by mixing the visible light emitted from the first fluorescent emissive layer 16, the first phosphorescent emissive layer 17 and the second phosphorescent emissive layer 33. For example, when the color of the visible light emitted from the first fluorescent emissive layer 16 is blue (B), and the colors of the light emitted from the first phosphorescent emissive layer 17 and the second phosphorescent emissive layer 33 are red (R), and green (G), the color of the visible light emitted from the organic electroluminescent devices 31 and 32 is three-element white mixed by red (R), green (G), and blue (B).

Fourth Embodiment

Figures 4, 5, 6:
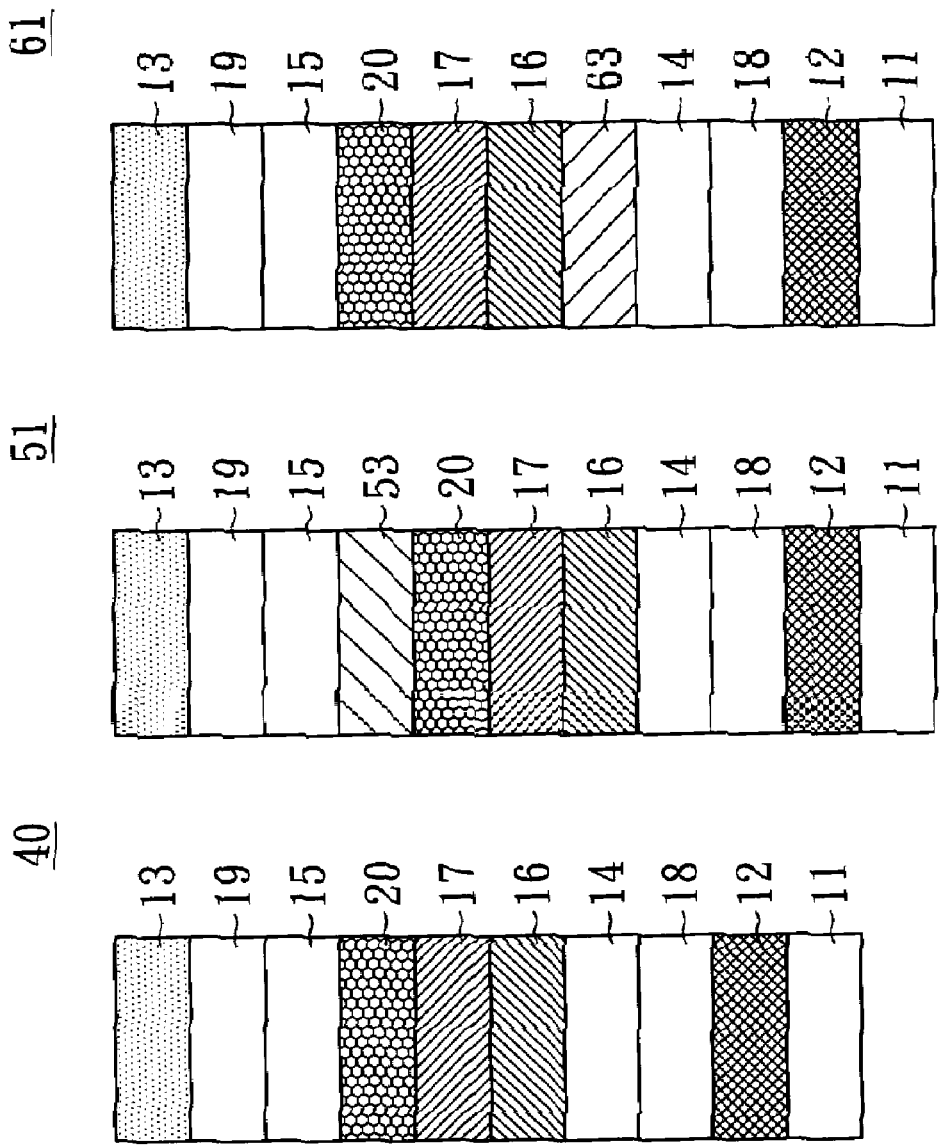
FIG. 4 is a cross-sectional view of an organic electroluminescent devices according to the fourth embodiment of the present invention.
FIG. 5 is a cross-sectional view of an organic electroluminescent device according to the fifth embodiment of the present invention.
FIG. 6 is a cross-sectional view of an organic electroluminescent device according to the sixth embodiment of the present invention.

Referring to FIG. 4, a cross-sectional view of an organic electroluminescent device according to the fourth embodiment of the present invention is illustrated. The differences between the organic electroluminescent device 10 of the first embodiment of the present invention and the organic electroluminescent device 40 of the present embodiment of the invention are the relative positions of the first fluorescent emissive layer 16, the first phosphorescent emissive layer 17 and the exciton blocking layer 20. The same other elements using the same reference numbers are not illustrated redundantly.

In FIG. 4, the first fluorescent emissive layer 16 is disposed on the hole transport layer 14. The first phosphorescent emissive layer 17 is disposed between the first fluorescent emissive layer 16 and the electron transport layer 15. Furthermore, the exciton blocking layer 20 is adjacent to the first fluorescent emissive layer 17. For example, the exciton blocking layer 20 is disposed between the first phosphorescent emissive layer 17 and the electron transport layer 15.

However, a person having ordinary skill in the art of the present invention can understand that the present invention is not limited thereto. For example, the exciton blocking layer 20 can be disposed between the first phosphorescent emissive layer 17 and the first fluorescent emissive layer 16. Moreover, the electron injection layer 19, the hole injection layer 18 and the exciton blocking layer 20 can be omitted in the organic electroluminescent device 40.

Fifth Embodiment

Referring to FIG. 5, a cross-sectional view of an organic electroluminescent device according to the fifth embodiment of the present invention is illustrated. Compared with the organic electroluminescent device 40 of the fourth embodiment of the present invention, the organic electroluminescent device 51 of the present embodiment of the invention further includes the second phosphorescent emissive layer 53. The same other elements using the same reference numbers are not illustrated redundantly.

In FIG. 5, the second phosphorescent emissive layer 53 is disposed between the first phosphorescent emissive layer 17 and the electron transport layer 15. In other words, the second phosphorescent emissive layer 53 is disposed between the exciton blocking layer 20 and the electron transport layer 15. The organic electroluminescent device 51 described above can further include another exciton blocking layer, for being adjacent to the second phosphorescent emissive layer 53.

However, a person having ordinary skill in the art of the present invention can understand that the present invention is not limited thereto. For example, the color of the visible light emitted from the second phosphorescent emissive layer 53 is substantially identical to or substantially different from the color of the visible light emitted from the first phosphorescent emissive layer 17. The color of the visible light emitted from the second phosphorescent emissive layer 53 includes red (R), green (G), and blue (B). The wavelength thereof ranges from about 400 nanometers (nm) to about 700 nanometers (nm). Furthermore, the electron injection layer 19, the hole injection layer 18 and the exciton blocking layer 20 can be omitted in the organic electroluminescent device 51.

Sixth Embodiment

Referring to FIG. 6, a cross-sectional view of an organic electroluminescent device according to the sixth embodiment of the present invention is illustrated. Compared with the organic electroluminescent device 51 of the fifth embodiment of the present invention, the organic electroluminescent device 61 of the present embodiment of the invention further includes the second fluorescent emissive layer 63. The same other elements using the same reference numbers are not illustrated redundantly.

In FIG. 6, the second fluorescent emissive layer 63 is disposed between the first fluorescent emissive layer 16 and the hole transport layer 14.

However, a person having ordinary skill in the art of the present invention can understand that the present invention is not limited thereto. For example, the color of the visible light emitted from the second fluorescent emissive layer 63 is substantially identical to or substantially different from the color of the visible light emitted from the first fluorescent emissive layer 16. The color of the visible light emitted from the second fluorescent emissive layer 63 includes red (R), green (G), and blue (B). The wavelength thereof ranges from about 400 nanometers (nm) to about 700 nanometers (nm). Moreover, the electron injection layer 19, the hole injection layer 18 and the exciton blocking layer 20 can be omitted in the organic electroluminescent 61.

Seventh Embodiment

Figure 7:
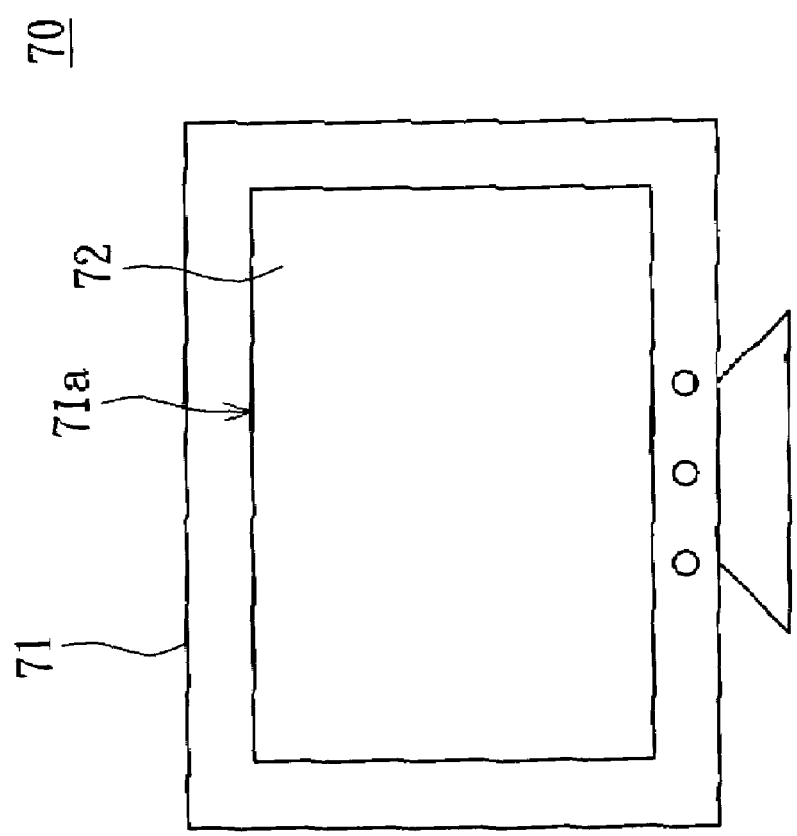
FIG. 7 illustrates a flat panel display according to the seventh embodiment of the present invention applying the organic electroluminescent device described above.

Referring to FIG. 7, a flat panel display according to the seventh embodiment of the present invention applying the organic electroluminescent device described above is illustrated. A flat panel display 70 can be a computer screen, a flat panel television or a monitor screen. In flat panel display of the present embodiment of the invention, the flat panel display 70 is a computer screen for instance.

In FIG. 7, the flat panel display 70 includes a housing 71 and a display panel 72. The display panel 72 at lease includes the organic electroluminescent device 10, 21, 22, 31, 32, 40, 51 or 61 and is disposed in the housing 71. Moreover, a display area of the display panel 72 is exposed to the surroundings through a front opening 71a of the housing 71.

Eighth Embodiment

Figure 8:
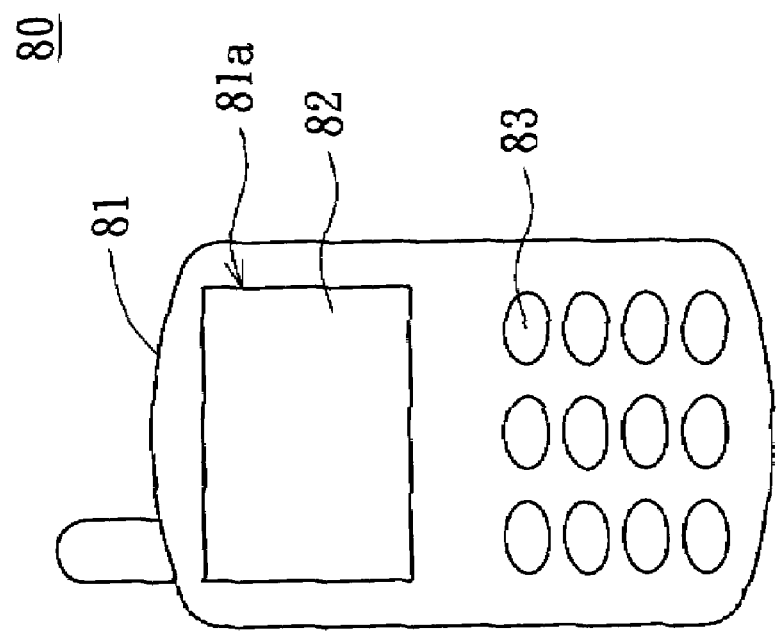
FIG. 8 illustrates a portable display device according to the eighth embodiment of the present invention applying the organic electroluminescent device described above.

Referring to FIG. 8, a portable display device according to the eighth embodiment of the present invention applying the organic electroluminescent device described above is illustrated. A portable display device 80 can be a mobile phone, a hand-held videogame, a digital camera (DC), a digital video (DV), a digital player, a personal digital assistant (PDA), a notebook or a table PC. In the portable display device of the present embodiment of the invention, the portable display device 80 is a mobile phone for instance.

In FIG. 8, the portable display device 80 includes a housing 81, a display panel 82 and a set of buttons 83. The display panel 82 at least includes the organic electroluminescent device 10, 21, 22, 31, 32, 40, 51 or 61 and is disposed in the housing 81. Moreover, a display area of the display panel 82 is exposed to the surroundings through a front opening 81a of the housing 81. The set of buttons 83 is disposed on a front surface of the housing 81 and is positioned on a side of the display panel 81.

The luminance efficiency of the organic electroluminescent devices described in the embodiments of the present invention is better than that of the conventional organic electroluminescent device having only the fluorescent host-dopant system (such as a fluorescent device) because the luminance efficiency of the phosphorescent emissive layer is better than that of the fluorescent emissive layer. The concentration of the triplet excitons is lowered by the fluorescent excitons. Therefore, the colliding probability of the triplet excitons is decreased effectively, and triplet-triplet annihilation is avoided. The decline of the luminance efficiency of the organic electroluminescent devices is restrained in high operating brightness. The brightness and the luminance efficiency of the organic electroluminescent devices of the embodiments of the present invention are much better than those of the conventional phosphorescent device.

Furthermore, the number of the fluorescent emissive layer and the phosphorescent emissive layer in the organic electroluminescent device can be increased according to the demands of the display effect and the color performance. The exciton blocking layer 20 in the embodiments of the present invention is adjacent to the phosphorescent emissive layer. However, when more than two phosphorescent emissive layers are provided, the exciton blocking layers can be adjacent to the phosphorescent emissive layers respectively to obtain a better luminance efficiency of the device.

Moreover, the conventional fully fluorescent white light organic electroluminescent device has a disadvantage of low efficiency. The low efficiency results from the low distribution ratio of the electron spin state of the fluorescent singlet excitons. The conventional fully phosphorescent white light organic electroluminescent device has high luminance efficiency. However, the serious triplet-triplet annihilation is its disadvantage. The white light of the OLED of the embodiments of the present invention includes the light from the fluorescent excitons and the phosphorescent excitons instead of the light all from phosphorescent excitons. Therefore, the white light organic electroluminescent device can still have the high luminance efficiency, and the luminance efficiency does not change seriously with the increasing of injected electric current. The disadvantages of the conventional fully fluorescent white light organic electroluminescent device and the conventional fully phosphorescent white light organic electroluminescent device are solved.

While the invention has been described by way of example and in terms of embodiments, it is to be understood that the present invention is not limited thereto. On the contrary, it is intended to cover various modifications and similar arrangements and procedures, and the scope of the appended claims therefore should be accorded the broadest interpretation so as to encompass all such modifications and similar arrangements and procedures.

We claim:

1. An organic electroluminescent device, comprising:
a substrate;
a first electrode and a second electrode opposite to the first electrode disposed over the substrate;
a hole transport layer disposed between the first electrode and the second electrode;
an electron transport layer disposed between the second electrode and the hole transport layer;
at least three emissive layers disposed between the hole transport layer and the electron transport layer, so that two of the at least three emissive layers comprises a group and another of the at least three emissive layers comprises an un-group, one of the layers of the group being a first fluorescent emissive layer and another of the layers of the group being a first phosphorescent emissive layer, wherein the visible light of the first fluorescent emissive layer and the visible light of the first phosphorescent emissive layer are not absorbed by each other, and the visible light spectrums of the first fluorescent emissive layer and the visible light spectrums of the first phosphorescent emissive layer are not affected by each other; and
an exciton blocking layer disposed between the group and the un-group.

2. The device of claim 1, wherein the un-group comprises a second fluorescent emissive layer or a second phosphorescent.

3. The device of claim 1, wherein the un-group is disposed between the exciton blocking layer and the hole transport layer.

4. The device of claim 1, wherein the un-group is disposed between the exciton blocking layer and the electron transport layer.

5. The device of claim 3, wherein the first phosphorescent emissive layer is disposed below the electron transport layer, the first fluorescent emissive layer is disposed between the first phosphorescent emissive layer and the exciton blocking layer.

6. The device of claim 4, wherein the first phosphorescent emissive layer is disposed below the electron transport layer, the first fluorescent emissive layer is disposed between the first phosphorescent emissive layer and the exciton blocking layer.

7. The device of claim 3, wherein the first phosphorescent emissive layer is disposed over the hole transport layer, the first fluorescent emissive layer is disposed between the first phosphorescent emissive layer and the exciton blocking layer.

8. The device of claim 4, wherein the first fluorescent emissive layer is disposed over the hole transport layer, the first phosphorescent emissive layer is disposed between the first fluorescent emissive layer and the exciton layer.

9. The device of claim 1, further comprising:
an electron injection layer disposed between the second electrode and the electron transport layer; and
a hole injection layer disposed between the first electrode and the hole transport layer.

10. A flat panel display comprising the organic electroluminescent device of claim 1.

11. A portable display device comprising the organic electroluminescent device of claim 1.

12. An organic electroluminescent device, comprising:
a substrate;
an first electrode and a second electrode opposite to the first electrode disposed over the substrate;

a hole transport layer disposed between the first electrode and the second electrode;

an electron transport layer disposed between the second electrode and the hole transport layer; and at least three emissive layers, including a first layer, a second layer, and a third layer, being stacked between the hole transport layer and the electron transport layer, wherein the first layer is a first fluorescent emissive layer with a first dopant, the second layer is a first phosphorescent emissive layer with a second dopant, and the third layer comprises a second phosphorescent emissive layer or a second fluorescent emissive layer with a third dopant, so that the visible light of each of the at least three emissive layers are not absorbed by each other, and the visible light spectrums of each of the at least three emissive layers are not affected by each other.

13. The device of claim 12, further comprising:
an exciton blocking layer adjacent to the first phosphorescent emissive layer.

14. The device of claim 12, further comprising:
an electron injection layer disposed between the second electrode and the electron transport layer; and
a hole injection layer disposed between the first electrode and the hole transport layer.

15. A flat panel display comprising the organic electroluminescent device of claim 12.

16. A portable display device comprising the organic electroluminescent device of claim 12.

* * * * *